US007558142B2

(12) United States Patent
Klein

(10) Patent No.: US 7,558,142 B2
(45) Date of Patent: *Jul. 7, 2009

(54) METHOD AND SYSTEM FOR CONTROLLING REFRESH TO AVOID MEMORY CELL DATA LOSSES

(75) Inventor: Dean A. Klein, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/001,709

(22) Filed: Dec. 11, 2007

(65) Prior Publication Data

US 2008/0151671 A1 Jun. 26, 2008

Related U.S. Application Data

(60) Continuation of application No. 11/899,643, filed on Sep. 6, 2007, which is a continuation of application No. 11/378,898, filed on Mar. 17, 2006, now Pat. No. 7,280,386, which is a division of application No. 10/892,773, filed on Jul. 15, 2004, now Pat. No. 7,116,602.

(51) Int. Cl.
*G11C 7/00* (2006.01)

(52) U.S. Cl. ............. 365/222; 365/189.07; 365/230.09; 365/236

(58) Field of Classification Search ................. 365/222, 365/189.07, 230.09, 236
See application file for complete search history.

(56) References Cited

U.S. PATENT DOCUMENTS

| | | | |
|---|---|---|---|
| 4,334,295 A | 6/1982 | Nagami | 365/222 |
| 4,433,211 A | 2/1984 | McCalmont et al. | 179/1.5 S |
| 4,598,402 A | 7/1986 | Matsumoto et al. | 371/38 |
| 4,706,249 A | 11/1987 | Nakagawa et al. | 371/38 |
| 4,710,934 A | 12/1987 | Traynor | 371/38 |
| 4,766,573 A | 8/1988 | Takemae | 365/222 |
| 4,780,875 A | 10/1988 | Sakai | 371/38 |
| 4,858,236 A | 8/1989 | Ogasawara | 371/38 |
| 4,862,463 A | 8/1989 | Chen | 371/38 |
| 4,918,692 A | 4/1990 | Hidaka et al. | 371/2.2 |
| 4,937,830 A | 6/1990 | Kawashima et al. | 371/40.1 |
| 4,958,325 A | 9/1990 | Nakagome et al. | 365/206 |
| 5,056,089 A | 10/1991 | Furuta et al. | 371/3 |
| 5,127,014 A | 6/1992 | Raynham | 371/37.3 |
| 5,172,339 A | 12/1992 | Noguchi et al. | 365/201 |
| 5,278,796 A | 1/1994 | Tillinghast et al. | 365/211 |
| 5,291,498 A | 3/1994 | Jackson et al. | 371/40.1 |
| 5,307,356 A | 4/1994 | Fifield | 371/40.1 |

(Continued)

OTHER PUBLICATIONS

Stojko, J. et al., "*Error-Correction Code*", IBM Technical Disclosure Bulletin, vol. 10, No. 10, Mar. 1968.

*Primary Examiner*—Hoai V Ho
(74) *Attorney, Agent, or Firm*—Dorsey & Whitney LLP

(57) ABSTRACT

A DRAM includes a register storing subsets of row addresses corresponding to rows containing at least one memory cell that is unable to store a data bit during a normal refresh cycle. Each subset includes all but the most significant bit of a corresponding row address. A refresh counter in the DRAM generates refresh row addresses that are used to refresh rows of memory cells. The refresh row addresses are compared to the subsets of row addresses that are stored in the register. In the event of a match, the row of memory cells corresponding to the matching subset of bits is refreshed. The number of refreshes occurring each refresh cycle will depend upon the number of bits in the subset that are omitted from the row address. The memory cells that are unable to retain data bits are identified by a modified sense amplifier.

9 Claims, 5 Drawing Sheets

U.S. PATENT DOCUMENTS

| | | | |
|---|---|---|---|
| 5,313,425 A | 5/1994 | Lee et al. | 365/201 |
| 5,313,464 A | 5/1994 | Reiff | 371/2.1 |
| 5,313,475 A | 5/1994 | Cromer et al. | 371/40.1 |
| 5,313,624 A | 5/1994 | Harriman et al. | 395/575 |
| 5,321,661 A | 6/1994 | Iwakiri et al. | 365/222 |
| 5,335,201 A | 8/1994 | Walther et al. | 365/222 |
| 5,369,651 A | 11/1994 | Marisetty | 371/40.1 |
| 5,418,796 A | 5/1995 | Price et al. | 371/39.1 |
| 5,428,630 A | 6/1995 | Weng et al. | 371/40.1 |
| 5,432,802 A | 7/1995 | Tsuboi | 371/40.1 |
| 5,446,695 A | 8/1995 | Douse et al. | 365/222 |
| 5,448,578 A | 9/1995 | Kim | 371/40.4 |
| 5,450,424 A | 9/1995 | Okugaki et al. | 371/40.1 |
| 5,455,801 A | 10/1995 | Blodgett et al. | 365/222 |
| 5,459,742 A | 10/1995 | Cassidy et al. | 371/40.1 |
| 5,481,552 A | 1/1996 | Aldereguia et al. | 371/40.1 |
| 5,509,132 A | 4/1996 | Matsuda et al. | 395/403 |
| 5,513,135 A | 4/1996 | Dell et al. | 365/52 |
| 5,515,333 A | 5/1996 | Fujita et al. | 365/229 |
| 5,588,112 A | 12/1996 | Dearth et al. | 395/182.07 |
| 5,600,662 A | 2/1997 | Zook | 371/40.1 |
| 5,604,703 A | 2/1997 | Nagashima | 365/200 |
| 5,623,506 A | 4/1997 | Dell et al. | 371/40.1 |
| 5,629,898 A | 5/1997 | Idei et al. | 365/222 |
| 5,631,914 A | 5/1997 | Kashida et al. | 371/37.4 |
| 5,703,823 A | 12/1997 | Douse et al. | 365/222 |
| 5,706,225 A | 1/1998 | Buchenrieder et al. | 365/102 |
| 5,712,861 A | 1/1998 | Inoue et al. | 371/37.1 |
| 5,732,092 A | 3/1998 | Shinohara | 371/40.2 |
| 5,740,188 A | 4/1998 | Olarig | 371/40.11 |
| 5,754,753 A | 5/1998 | Smelser | 395/182.06 |
| 5,761,222 A | 6/1998 | Baldi | 371/40.18 |
| 5,765,185 A | 6/1998 | Lambrache et al. | 711/103 |
| 5,784,328 A | 7/1998 | Irrinki et al. | 365/222 |
| 5,784,391 A | 7/1998 | Konigsburg | 371/40.18 |
| 5,808,952 A | 9/1998 | Fung et al. | 365/222 |
| 5,841,418 A | 11/1998 | Bril et al. | 345/3 |
| 5,864,569 A | 1/1999 | Roohparvar | 371/40.18 |
| 5,878,059 A | 3/1999 | Maclellan | 371/40.13 |
| 5,896,404 A | 4/1999 | Kellogg et al. | 371/40.11 |
| 5,912,906 A | 6/1999 | Wu et al. | 371/40.11 |
| 5,953,278 A | 9/1999 | McAdams et al. | 365/219 |
| 5,961,660 A | 10/1999 | Capps, Jr. et al. | 714/763 |
| 5,963,103 A | 10/1999 | Blodgett | 331/75 |
| 6,009,547 A | 12/1999 | Jaquette et al. | 714/758 |
| 6,009,548 A | 12/1999 | Chen et al. | 714/762 |
| 6,018,817 A | 1/2000 | Chen et al. | 714/762 |
| 6,041,001 A | 3/2000 | Estakhri | 365/200 |
| 6,041,430 A | 3/2000 | Yamauchi | 714/752 |
| 6,085,283 A | 7/2000 | Toda | 711/104 |
| 6,085,334 A | 7/2000 | Giles et al. | 714/7 |
| 6,092,231 A | 7/2000 | Sze | 714/758 |
| 6,101,614 A | 8/2000 | Gonzales et al. | 714/6 |
| 6,125,467 A | 9/2000 | Dixon | 714/763 |
| 6,134,167 A | 10/2000 | Atkinson | 365/222 |
| 6,178,537 B1 | 1/2001 | Roohparvar | 714/773 |
| 6,199,139 B1 | 3/2001 | Katayama et al. | 711/106 |
| 6,212,118 B1 | 4/2001 | Fujita | 365/222 |
| 6,212,631 B1 | 4/2001 | Springer et al. | 713/1 |
| 6,216,246 B1 | 4/2001 | Shau | 714/763 |
| 6,216,247 B1 | 4/2001 | Creta et al. | 714/763 |
| 6,219,807 B1 | 4/2001 | Ebihara et al. | 714/720 |
| 6,223,309 B1 | 4/2001 | Dixon et al. | 714/703 |
| 6,233,717 B1 | 5/2001 | Choi | 714/805 |
| 6,262,925 B1 | 7/2001 | Yamasaki | 365/200 |
| 6,279,072 B1 | 8/2001 | Williams et al. | 711/105 |
| 6,310,825 B1 | 10/2001 | Furuyama | 365/233 |
| 6,324,119 B1 | 11/2001 | Kim | 365/233 |
| 6,349,068 B2 | 2/2002 | Takemae et al. | 365/222 |
| 6,349,390 B1 | 2/2002 | Dell et al. | 714/6 |
| 6,353,910 B1 | 3/2002 | Carnevale et al. | 714/763 |
| 6,397,290 B1 | 5/2002 | Williams et al. | 711/105 |
| 6,397,357 B1 | 5/2002 | Cooper | 714/703 |
| 6,397,365 B1 | 5/2002 | Brewer et al. | 714/766 |
| 6,438,066 B1 | 8/2002 | Ooishi et al. | 365/233 |
| 6,442,644 B1 | 8/2002 | Gustavson et al. | 711/105 |
| 6,457,153 B2 | 9/2002 | Yamamoto et al. | 714/763 |
| 6,484,246 B2 | 11/2002 | Tsuchida et al. | 711/169 |
| 6,510,537 B1 | 1/2003 | Lee | 714/763 |
| 6,526,537 B2 | 2/2003 | Kishino | 714/763 |
| 6,549,460 B2 | 4/2003 | Nozoe et al. | 365/185.09 |
| 6,556,497 B2 | 4/2003 | Cowles et al. | 365/222 |
| 6,557,072 B2 | 4/2003 | Osborn | 711/106 |
| 6,560,155 B1 | 5/2003 | Hush | 365/222 |
| 6,584,543 B2 | 6/2003 | Williams et al. | 711/105 |
| 6,591,394 B2 | 7/2003 | Lee et al. | 714/766 |
| 6,594,796 B1 | 7/2003 | Chiang | 714/800 |
| 6,601,211 B1 | 7/2003 | Norman | 714/773 |
| 6,603,694 B1 | 8/2003 | Frankowsky et al. | 365/222 |
| 6,609,236 B2 | 8/2003 | Watanabe et al. | 716/8 |
| 6,614,698 B2 | 9/2003 | Ryan et al. | 365/189.04 |
| 6,618,281 B1 | 9/2003 | Gordon | 365/49 |
| 6,618,319 B2 | 9/2003 | Ooishi et al. | 365/233 |
| 6,628,558 B2 | 9/2003 | Fiscus | 365/222 |
| 6,636,444 B2 | 10/2003 | Uchida et al. | 365/189.05 |
| 6,636,446 B2 | 10/2003 | Lee et al. | 365/194 |
| 6,646,942 B2 | 11/2003 | Janzen | 365/222 |
| 6,662,333 B1 | 12/2003 | Zhang et al. | 714/767 |
| 6,665,231 B2 | 12/2003 | Mizuno et al. | 365/233 |
| 6,678,860 B1 | 1/2004 | Lee | 714/763 |
| 6,697,926 B2 | 2/2004 | Johnson et al. | 711/167 |
| 6,697,992 B2 | 2/2004 | Ito et al. | 714/763 |
| 6,701,480 B1 | 3/2004 | Karpuszka et al. | 714/764 |
| 6,704,230 B1 | 3/2004 | DeBrosse et al. | 365/201 |
| 6,715,104 B2 | 3/2004 | Imbert de Tremiolles et al. | 714/25 |
| 6,715,116 B2 | 3/2004 | Lester et al. | 714/718 |
| 6,735,726 B2 | 5/2004 | Muranaka et al. | 714/708 |
| 6,751,143 B2 | 6/2004 | Morgan et al. | 365/222 |
| 6,754,858 B2 | 6/2004 | Borkenhagen et al. | 714/720 |
| 6,775,190 B2 | 8/2004 | Setogawa | 365/193 |
| 6,778,457 B1 | 8/2004 | Burgan | 365/222 |
| 6,781,908 B1 | 8/2004 | Pelley et al. | 365/222 |
| 6,788,616 B2 | 9/2004 | Takahashi | 365/233 |
| 6,789,209 B1 | 9/2004 | Suzuki et al. | 713/401 |
| 6,792,567 B2 | 9/2004 | Laurent | 714/763 |
| 6,795,362 B2 | 9/2004 | Nakai et al. | 365/222 |
| 6,807,108 B2 | 10/2004 | Maruyama et al. | 365/189.05 |
| 6,810,449 B1 | 10/2004 | Barth et al. | 710/61 |
| 6,819,624 B2 | 11/2004 | Acharya et al. | 365/233 |
| 6,834,022 B2 | 12/2004 | Derner et al. | 365/222 |
| 6,934,199 B2 | 8/2005 | Johnson et al. | 365/194 |
| 6,940,773 B2 | 9/2005 | Poechmueller | 365/222 |
| 6,965,537 B1 | 11/2005 | Klein et al. | 365/222 |
| 7,027,337 B2 | 4/2006 | Johnson et al. | 365/194 |
| 7,095,669 B2 | 8/2006 | Oh | 365/222 |
| 7,096,407 B2 | 8/2006 | Olarig | 714/768 |
| 7,099,221 B2 | 8/2006 | Klein | 365/222 |
| 7,116,602 B2 | 10/2006 | Klein | 365/222 |
| 7,117,420 B1 | 10/2006 | Yeung et al. | 714/763 |
| 7,149,141 B2 | 12/2006 | Johnson et al. | 365/226 |
| 7,171,605 B2 | 1/2007 | White | 714/763 |
| 7,184,352 B2 | 2/2007 | Klein et al. | 365/222 |
| 7,254,067 B2 | 8/2007 | Johnson et al. | 365/194 |
| 7,272,066 B2 * | 9/2007 | Klein | 365/222 |
| 7,277,345 B2 | 10/2007 | Klein | 365/222 |
| 7,280,386 B2 | 10/2007 | Klein | |
| 2001/0023496 A1 | 9/2001 | Yamamoto et al. | 714/763 |
| 2001/0029592 A1 | 10/2001 | Walker et al. | 714/42 |
| 2001/0044917 A1 | 11/2001 | Lester et al. | 714/718 |
| 2001/0052090 A1 | 12/2001 | Mio | 714/42 |
| 2001/0052102 A1 | 12/2001 | Roohparvar | 714/773 |
| 2002/0013924 A1 | 1/2002 | Yamasoto | 714/763 |
| 2002/0029316 A1 | 3/2002 | Williams et al. | 711/105 |

| | | | |
|---|---|---|---|
| 2002/0144210 A1 | 10/2002 | Borkenhagen et al. | 714/805 |
| 2002/0152444 A1 | 10/2002 | Chen et al. | 714/785 |
| 2002/0162069 A1 | 10/2002 | Laurent | 714/763 |
| 2002/0184592 A1 | 12/2002 | Koga et al. | 714/763 |
| 2003/0009721 A1 | 1/2003 | Hsu et al. | 714/773 |
| 2003/0070054 A1 | 4/2003 | Williams et al. | 711/173 |
| 2003/0093744 A1 | 5/2003 | Leung et al. | 714/763 |
| 2003/0097608 A1 | 5/2003 | Rodeheffer et al. | 714/7 |
| 2003/0101405 A1 | 5/2003 | Shibata | 714/763 |
| 2003/0149855 A1 | 8/2003 | Shibata et al. | 711/200 |
| 2003/0167437 A1 | 9/2003 | DeSota et al. | 714/763 |
| 2003/0191888 A1 | 10/2003 | Klein | 711/105 |
| 2004/0008562 A1 | 1/2004 | Ito et al. | 365/223 |
| 2004/0064646 A1 | 4/2004 | Emerson et al. | 711/131 |
| 2004/0083334 A1 | 4/2004 | Chang et al. | 711/103 |
| 2004/0098654 A1 | 5/2004 | Cheng et al. | 714/758 |
| 2004/0117723 A1 | 6/2004 | Foss | 714/805 |
| 2004/0225944 A1 | 11/2004 | Brueggen | 714/758 |
| 2005/0099868 A1 | 5/2005 | Oh | 365/222 |
| 2005/0249010 A1 | 11/2005 | Klein | 365/222 |
| 2005/0289444 A1 | 12/2005 | Klein | 714/793 |
| 2006/0010339 A1 | 1/2006 | Klein | 714/5 |
| 2006/0013052 A1 | 1/2006 | Klein | 365/222 |
| 2006/0044913 A1 | 3/2006 | Klein | 365/222 |
| 2006/0056259 A1 | 3/2006 | Klein | 365/222 |
| 2006/0056260 A1 | 3/2006 | Klein | 365/222 |
| 2006/0069856 A1 | 3/2006 | Klein | 711/106 |
| 2006/0152989 A1 | 7/2006 | Klein | 365/222 |
| 2006/0158949 A1 | 7/2006 | Klein | 365/222 |
| 2006/0158950 A1 | 7/2006 | Klein | 365/222 |
| 2006/0206769 A1 | 9/2006 | Klein | 714/52 |
| 2006/0218469 A1 | 9/2006 | Klein | 714/763 |
| 2007/0268756 A1 | 11/2007 | Johnson et al. | 365/189.01 |
| 2008/0092016 A1 | 4/2008 | Pawlowski | 714/764 |
| 2008/0109705 A1 | 5/2008 | Pawlowski et al. | 714/767 |

* cited by examiner

METHOD AND SYSTEM FOR CONTROLLING REFRESH TO AVOID MEMORY CELL DATA LOSSES

CROSS-REFERENCE TO RELATED APPLICATION

This application is a continuation of U.S. patent application Ser. No. 11/899,643 filed Sep. 6, 2007, which is a continuation of U.S. patent application Ser. No. 11/378,898 filed Mar. 17, 2006 and issued as U.S. Pat. No. 7,280,386, which is a divisional of U.S. patent application Ser. No. 10/892,773, filed Jul. 15, 2004 and issued as U.S. Pat. No. 7,116,602 on Oct. 3, 2006.

TECHNICAL FIELD

This invention relates to dynamic random access memory ("DRAM") devices, and, more particularly, to a sense amplifier and method for detecting rows containing at least one memory cell that is prone to data losses during refresh and a method and system for adjusting the refresh rate of rows of memory cells to prevent for such data losses.

BACKGROUND OF THE INVENTION

As the use of electronic devices, such as personal computers, continue to increase, it is becoming ever more important to make such devices portable. The usefulness of portable electronic devices, such as notebook computers, is limited by the limited length of time batteries are capable of powering the device before needing to be recharged. This problem has been addressed by attempts to increase battery life and attempts to reduce the rate at which such electronic devices consume power.

Various techniques have been used to reduce power consumption in electronic devices, the nature of which often depends upon the type of power consuming electronic circuits that are in the device. For example, electronic devices, such a notebook computers, typically include dynamic random access memory ("DRAM") devices that consume a substantial amount of power. As the data storage capacity and operating speeds of DRAMs continues to increase, the power consumed by such devices has continued to increase in a corresponding manner.

A conventional synchronous dynamic random access memory ("SDRAM") is shown in FIG. 1. The SDRAM 10 includes an address register 12 that receives bank addresses, row addresses and column addresses on an address bus 14. The address bus 14 is generally coupled to a memory controller (not shown in FIG. 1). Typically, a bank address is received by the address register 12 and is coupled to bank control logic 16 that generates bank control signals, which are described further below. The bank address is normally coupled to the SDRAM 10 along with a row address. The row address is received by the address register 12 and applied to a row address multiplexer 18. The row address multiplexer 18 couples the row address to row address latch & decoder circuit 20a-d for each of several banks of memory cell arrays 22a-d, respectively. One of the latch & decoder circuits 20a-d is enabled by one of the control signals from the bank control logic 16 depending on which bank of memory cell arrays 22a-d is selected by the bank address. The selected latch & decoder circuit 20 applies various signals to its respective bank 22 as a function of the row address stored in the latch & decoder circuit 20. These signals include word line voltages that activate respective rows of memory cells in the banks 22.

The row address multiplexer 18 also couples row addresses to the row address latch & decoder circuits 20a-d for the purpose of refreshing the memory cells in the banks 22a-d. The row addresses are generated for refresh purposes by a refresh counter 30.

After the bank and row addresses have been applied to the address register 12, a column address is applied to the address register 12. The address register 12 couples the column address to a column address counter/latch circuit 32. The counter/latch circuit 32 stores the column address, and, when operating in a burst mode, generates column addresses that increment from the received column address. In either case, either the stored column address or incrementally increasing column addresses are coupled to column address & decoders 38a-d for the respective banks 22a-d. The column address & decoders 38a-d apply various signals to respective sense amplifiers 40a-d through column interface circuitry 42. The column interface circuitry 42 includes conventional I/O gating circuits, DQM mask logic, read data latches for storing read data from the memory cells in the banks 22 and write drivers for coupling write data to the memory cells in the banks 22.

Data to be read from one of the banks 22a-d are sensed by the respective set of sense amplifiers 40a-d and then stored in the read data latches in the column interface circuitry 42. The data are then coupled to a data output register 44, which applies the read data to a data bus 48. Data to be written to the memory cells in one of the banks 22a-d is coupled from the data bus 48 through a data input register 50 to write drivers in the column interface circuitry 42. The write drivers then couple the data to the memory cells in one of the banks 22a-d. A data mask signal "DQM" is applied to the column interface circuitry 42 and the data output register 44 to selectively alter the flow of data into and out of the column interface circuitry 42, such as by selectively masking data to be read from the banks of memory cell arrays 22a-d.

The above-described operation of the SDRAM 10 is controlled by control logic 56, which includes a command decoder 58 that receives command signals through a command bus 60. These high level command signals, which are typically generated by a memory controller (not shown in FIG. 1), are a clock a chip select signal CS#, a write enable signal WE#, a column address strobe signal CAS#, and a row address strobe signal RAS#, with the "#" designating the signal as active low. Various combinations of these signals are registered as respective commands, such as a read command or a write command. The control logic 56 also receives a clock signal CLK and a clock enable signal CKE#, which cause the SDRAM 10 to operate in a synchronous manner. The control logic 56 generates a sequence of control signals responsive to the command signals to carry out the function (e.g., a read or a write) designated by each of the command signals. The control logic 56 also applies signals to the refresh counter 30 to control the operation of the refresh counter 30 during refresh of the memory cells in the banks 22. The control signals generated by the control logic 56, and the manner in which they accomplish their respective functions, are conventional. Therefore, in the interest of brevity, a further explanation of these control signals will be omitted. The control logic 56 also includes a mode register 64 that may be programmed by signals coupled through the command bus 60 during initialization of the SDRAM 10. The mode register 64 then generates mode control signals that are used by the control logic 56 to control the operation of the SDRAM 10 in various modes.

A sense amplifier 80 of the type typically used for the sense amplifiers 40a-d in the SDRAM 10 is shown in FIG. 2. As is well-known in the art, one sense amplifier 80 is provided for each column of memory cells in each array of the banks 22a-d, and it is coupled to all of the memory cells in its respective column through complementary digit lines D1, D1*. The sense amplifier 80 includes a pair of cross-coupled PMOS transistors 82, 84 that have their sources coupled to a positive control signal "ACT" and their drains coupled to the digit lines D1, D1*, respectively. The sense amplifier 80 also includes a pair of cross-coupled NMOS transistors 86, 88 that have their sources coupled to a negative control signal "NLAT*" and their drains coupled to the digit lines D1, D1*, respectively.

In operation, when a memory cell is being read, the voltage on one of the digit lines D1, D1* will be slightly greater than the voltage on the other one of digit lines D1, D1*. The ACT signal is then driven high and the NLAT* signal is driven low to enable the sense amplifier 80. The digit line D1, D1* having the lower voltage will turn on the PMOS transistor 82, 84 to a greater extent than the other PMOS transistor 82, 84 is turned on, thereby driving the digit line D1, D1* having the higher voltage high to a greater extent than the other digit line D1, D1* is driven high. Similarly, the digit line D1, D1* having the higher voltage will turn on the NMOS transistor 86, 88 to a greater extent than the other NMOS transistor 86, 88 is turned on, thereby driving the digit line D1, D1* having the lower voltage low to a greater extent than the other digit line D1, D1* is driven low. As a result, after a short delay, the digit line D1, D1* having the slightly greater voltage is driven to the voltage of the ACT signal (which is generally the supply voltage $V_{CC}$), and the other digit line D1, D1* is driven to the voltage of the NLAT* signal (which is generally ground potential).

In general, the power consumed by a DRAM, including, of course, the SDRAM 10, increases with both the capacity and the operating speed of the DRAMs. The power consumed by DRAMs is also affected by their operating mode. A DRAM, for example, will generally consume a relatively large amount of power when the memory cells of the DRAM are being refreshed. As is well-known in the art, DRAM memory cells, each of which essentially consists of a capacitor, must be periodically refreshed to retain data stored in the DRAM. Refresh is typically performed by essentially reading data bits from the memory cells in each row of a memory cell array and then writing those same data bits back to the same cells in the row. A relatively large amount of power is consumed when refreshing a DRAM because rows of memory cells in a memory cell array are being actuated in the rapid sequence. Each time a row of memory cells is actuated, a pair of digit lines for each memory cell are switched to complementary voltages and then equilibrated. As a result, DRAM refreshes tends to be particularly power-hungry operations. Further, since refreshing memory cells must be accomplished even when the DRAM is not being used and is thus inactive, the amount of power consumed by refresh is a critical determinant of the amount of power consumed by the DRAM over an extended period. Thus many attempts to reduce power consumption in DRAMs have focused on reducing the rate at which power is consumed during refresh.

Refresh power can, of course, be reduced by reducing the rate at which the memory cells in a DRAM are being refreshed. However, reducing the refresh rate increases the risk of data stored in the DRAM memory cells being lost. More specifically, since, as mentioned above, DRAM memory cells are essentially capacitors, charge inherently leaks from the memory cell capacitors generally either through the capacitors themselves or through respective access transistors coupled to the memory cell capacitors. In either case, charge leaking from the capacitors can change the value of a data bit stored in the memory cell over time. However, current leaks from DRAM memory cells at varying rates. Some memory cell capacitors are essentially short-circuited and are thus incapable of storing charge indicative of a data bit. These defective memory cells can be detected during production testing, and can then be repaired by substituting non-defective memory cells using conventional redundancy circuitry. On the other hand, current leaks from most DRAM memory cells at much slower rates that span a wide range. A DRAM refresh rate is chosen to ensure that all but a few memory cells can store data bits without data loss. This refresh rate is typically once every 64 ms. The memory cells that cannot reliably retain data bits at this refresh rate are detected during production testing and replaced by redundant memory cells. However, refreshing memory cells at a rate that is needed to allow all but the leakiest memory cells to retain data bits actually refreshes the overwhelming majority of the memory cells at a rate that is far higher than the rate needed for these memory cells to retain data bits. As a result, typically used refresh rates cause significantly more power to be consumed than is needed to avoid data loss in most of the memory cells.

Although memory cells that cannot reliably retain data are replaced by redundant memory cells during production testing, the rate of current leakage from DRAM memory cells can change after production testing. In fact, the rate of current leakage can change both as a matter of time and from subsequent production steps, such as in packaging DRAM chips. Current leakage, and hence the rate of data loss, can also be effected by environmental factors, such as the temperature of DRAMs. Therefore, despite production testing and repair, a few memory cells may be unable to retain stored data bits at normal refresh rates or during extended refresh if in low-power operation. In some cases, DRAMs that are unable to retain data during refresh can be detected during post-production testing, such as when memory cells become excessively leaky during packaging. The devices are then discarded, thereby reducing the manufacturing yield of the DRAMs. However, there is no solution for memory cells become excessively leaky during use because conventional DRAMs do not include any means for detecting memory cells that have become excessively leaky. Therefore, conventional DRAMs do not include any means to compensate for memory cells that have become excessively leaky, which could be used to prevent data loss.

One technique that has been used to reduce prevent data errors during refresh is to generate an error correcting code "ECC" from each item of data that is to be written to a DRAM, and to store the ECC along with the write data. When the stored data are to be read from the DRAM, the ECC is read and used to determine if the read data are in error. If the error occurs in less than a specific number of bits, the ECC can be used to correct the read data. Although the use of ECCs can significantly improve the reliability of data stored in the DRAMs, this technique requires that a significant portion of the DRAM storage capacity be used to store the ECCs, thus effectively reducing the storage capacity of the DRAM. ECC typically also slows memory write performance as the memory controller must first read, then merge, then write data to memory on any partial word write to memory. ECC also typically imposes a penalty of extra signal lines between memory and memory controller.

There is therefore a need for a method and system that detects DRAM memory cells that have become excessively leaky after production, and that adjusts the rate at which such memory cells are refreshed to prevent data loss while avoiding excessive refreshes of DRAM memory cells that do not suffer from leakage problems.

SUMMARY OF THE INVENTION

A dynamic random access memory ("DRAM") device and method includes a an array of memory cells arranged in rows and columns in which at least one memory cell in some of the rows may be unable to retain data bits during refresh. The rows containing at least one memory cell that is unable to retain a data bit are identified by first writing predetermined bits to the memory cells in each row of memory cells. After the rows have been refreshed, the data bits are read from the memory cells in each row, and a determination is made whether any of the read data bits differ from the corresponding data bits written to the memory cells in the row. This writing, refreshing and reading sequence may be performed as part of the normal operation of the DRAM device. Once the rows containing at least one memory cell that is unable to retain a data bit are identified, the identified rows of memory cells are refreshed at a rate that is faster than the rate that other rows of memory cells are refreshed. The refresh of identified rows is preferably accomplished by recording a subset of bits of an address for each identified row. Each subset contains all but at least the most significant bit of the row address. As refresh row addresses are generated for the rows of memory cells, each refresh row address is compared with each of the recorded subsets of bits. In the event of a match, the row of memory cells corresponding to the row address from which the matching subset of bits were obtained is refreshed.

DETAILED DESCRIPTION

Figure 3:
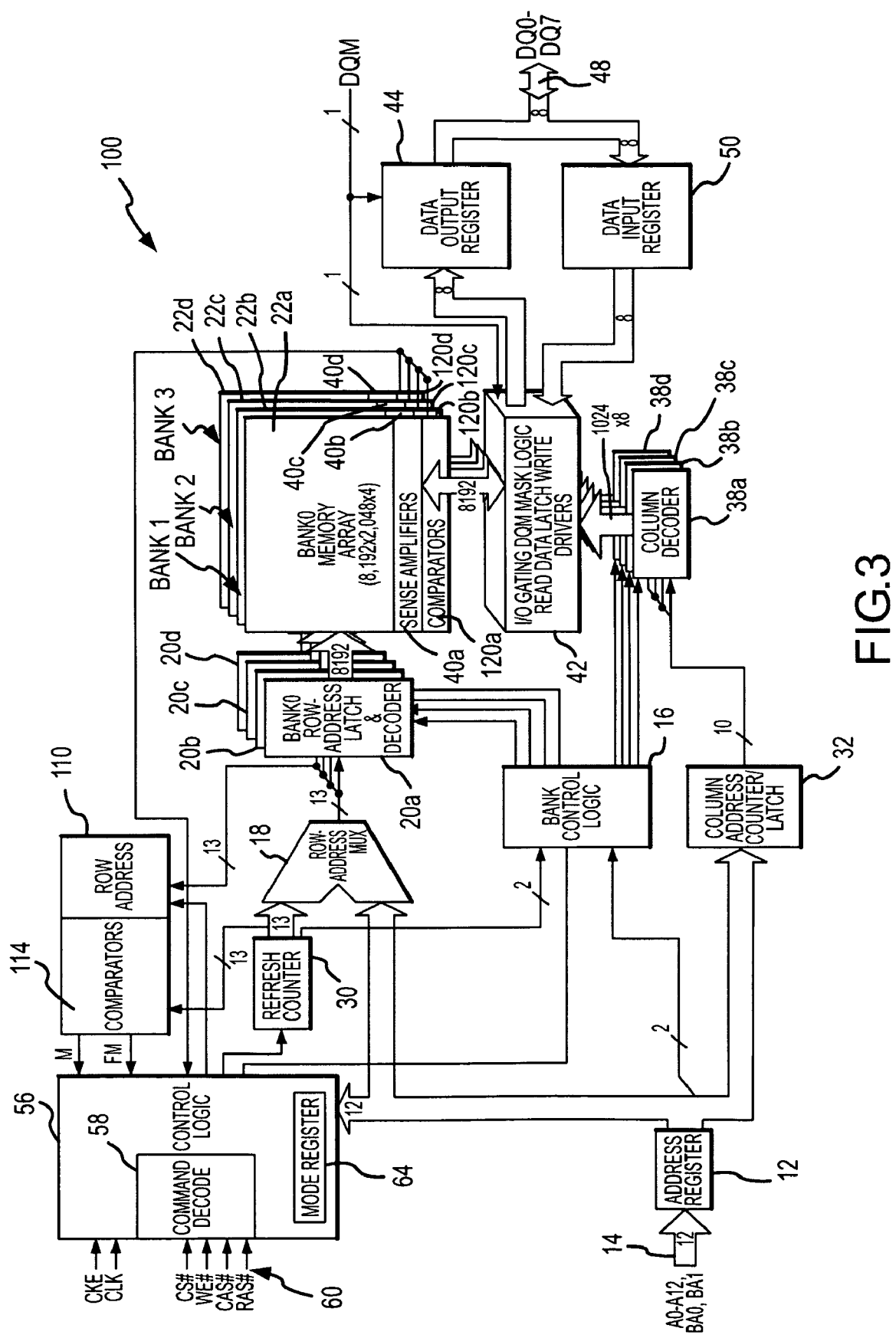
FIG. 3 is a block diagram of a dynamic random access memory device according to one embodiment of the invention.

One embodiment of an SDRAM 100 according to one embodiment of the present invention is shown in FIG. 3. The SDRAM 100 contains many of the same components that are used in the SDRAM 10 of FIG. 1, and they operate in substantially the same manner. Therefore, in the interest of brevity, these components have been provided with the same reference numerals, and an explanation of their function and operation will not be repeated. The SDRAM 100 differs from the SDRAM 10 in two primary respects. First, it includes a row address register 110 that stores a table of row addresses identifying rows of memory cells that contain at least one unusually leaky memory cell, and a set of comparators 114 that compare the row addresses in the table to a portion of each of the row addresses generated by the refresh counter 30. Second, the SDRAM 100 includes comparators 120$a$-$d$ coupled to respective sense amplifiers 40$a$-$d$ for detecting which rows of memory cells contain at least one unusually leaky memory cell.

Figure 4:
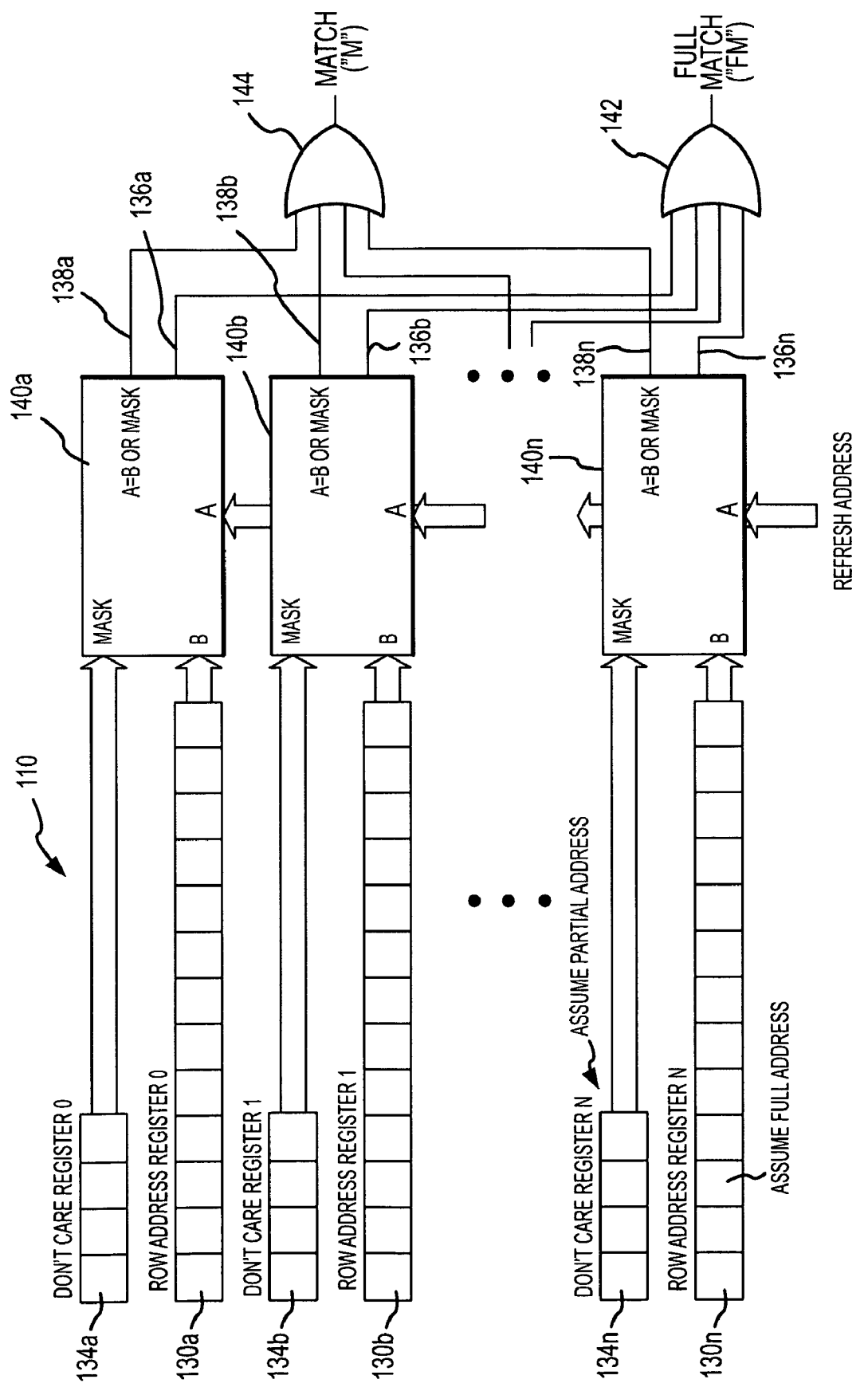
FIG. 4 is a block diagram of one embodiment of a comparator circuit that can be used in the dynamic random access memory of FIG. 3.

The row address register 110 and comparators 114 are shown in greater detail in FIG. 4. The row address register 110 includes several row address register units 130$a$-$n$ corresponding in number to the number of rows that are expected to contain at least one unusually leaky memory cell. Each of the register units 130$a$-$n$ stores a row address corresponding to a respective row containing at least one unusually leaky memory cell. The row address register 110 also includes partial row address register units 134$a$-$n$, each of which store a predetermined number of bits of the row address stored in a respective row address register unit 130$a$-$n$. The number of bits of the partial row address stored in the partial row address register units 134$a$-$n$ can all be the same or they can be different from each other. Corresponding row address registers units 130$a$-$n$ and partial row address register units 134$a$-$n$ are coupled to respective comparator units 140$a$-$n$, which also receives a refresh row address from the refresh counter 30. Each comparator unit 140$a$-$n$ compares the row address bits stored in its corresponding row address register unit 130$a$-$n$ to the refresh row address and generates a high output signal on line 136$a$-$n$ in the event of a match. Each comparator unit 140$a$-$n$ also compares the row address bits stored in its corresponding partial row address register unit 134$a$-$n$ to the corresponding bits of the refresh row address and generates a high output signal on line 138$a$-$n$ in the event of a match. Thus, for example, if one of the partial row address register units 134$a$-$n$ stores all but the two most significant bits ("MSBs") of a row address, the corresponding comparator unit 140$a$-$n$ will compare those bits to all but the two MSBs of the refresh row address from the refresh counter 30.

In the event of a match between the refresh counter 30 and the bits stored in one of the row address register units 130$a$-$n$, the corresponding comparator unit 140$a$-$n$ outputs a high that is coupled to an OR gate 142. If any of the comparator units 140$a$-$n$ output a high, the OR gate 142 outputs an active high FULL MATCH ("FM") signal. Thus, a FULL MATCH signal will be generated whenever the refresh row address from the refresh counter 30 matches a row address stored in one of the row address register units 130$a$-$n$.

In the event of a match between the bits stored in one of the partial row address register units 134$a$-$n$ and corresponding bits of the refresh row address from the refresh counter 30, the corresponding comparator unit 140$a$-$n$ outputs a high that is coupled to another OR gate 144. If any of the comparator units 140$a$-$n$ output a high, the OR gate 144 outputs an active high MATCH ("M") signal. Thus, a MATCH signal will be generated whenever the bits of a partial row address stored in one of the partial row address register units 134$a$-$n$ match the corresponding bits of a refresh row address from the refresh counter 30.

The number of times the MATCH signal is generated during each refresh cycle for each row having a row address stored in the row address register 110 will depend upon the number of row address bits stored in one of the partial row address register units 134$a$-$n$. For a simplified example, the MSB of a row having a row address of "110011" may be omitted from the bits stored in the partial row address register unit 134$a$-$n$ for that row. Thus, the partial row address register unit 134$a$-$n$ will store the address bits "10011." The bits stored in the partial row address register unit 134$a$-$n$ will therefore match the corresponding bits of a refresh row address from the refresh counter 30 when the refresh counter generates an address of "010011" and "110011." Thus, the row having a row address of "110011" will be refreshed twice each refresh cycle. If the two MSBs are omitted from the bits stored in the partial row address register unit 134a-n for that row, the partial row address register unit 134a-n will store the address bits "0011." Under these circumstances, the bits stored in the partial row address register unit 134a-n will match the corresponding bits of a refresh row address from the refresh counter 30 when the refresh counter generates an address of "000011", "010011", "100011" and "110011." The row having a row address of "110011" will therefore be refreshed four times each refresh cycle. By eliminating the three MSBs from the row address stored in the partial row address register unit 134a-n, the row having a row address of "110011" will be refreshed eight times each refresh cycle, and so forth.

Returning to FIG. 3, the FM output from the OR gate 142 and the M output from the OR gate 144 are coupled to the control logic 56. In the event the active high MATCH signal is generated but the active high FULL MATCH signal is not generated, the control logic 56 halts the refresh counter 30 from incrementing and inserts a refresh of the row stored in the corresponding row address register unit 130a-n. In the event both an active high MATCH signal and an active high FULL MATCH signal are generated, the control logic 56 does not halts the refresh counter 30 from incrementing because the refresh counter 30 is, at that time, outputting the row address for the row that would receive the extra refresh. There is therefore no need to halt the refresh counter 30 from incrementing.

As mentioned above, the number of row address bits stored in each of the partial row address register units 134a-n can vary among the units 134a-n or they can be the same for all of the units 134a-n. The number of stored bits preferably depends upon the rate at which one or more unusually leaky memory cells in the row leak charge. For a row containing memory cells with only relatively slight leaks, all but the MSB of the row address can be stored in the corresponding partial row address register unit 134a-n so that the row will be refreshed at twice the rate of non-leaky memory cells. For a row containing memory cells with more severe leaks, all but the two MSBs of the row address can be stored in the corresponding partial row address register unit 134a-n so that the row will be refreshed at four times the rate of non-leaky memory cells. The partial row address register unit 134a-n for a row containing memory cells with very severe leaks can store all but the three MSBs of the row address so that the row will be refreshed at eight times the rate of non-leaky memory cells.

Although the row address register units 130a-n and the partial row address register units 134a-n may be conventional volatile electronic storages device, other devices may also be used. For example, the row addresses and partial row addresses could be programmed into the SDRAM 100 by blowing a plurality of fuses or anti-fuses in patterns corresponding to the full or partial row addresses. The addresses of rows containing unusually leaky memory cells could also be stored externally of the SDRAM 100, such as in a memory module (not shown) containing several of the SDRAMs 100. The data corresponding to these row addresses could then be provided to the SDRAMs 100 by suitable means, such as by loading the data into the mode register 64 (FIG. 3) at power-on. Data corresponding to the row addresses of the rows containing leaky memory cells could also be stored in a non-volatile memory device, such as in a serial EEPROM that was either external or internal to the SDRAM 100. Other variations will be apparent to one skilled in the art.

Figure 1:
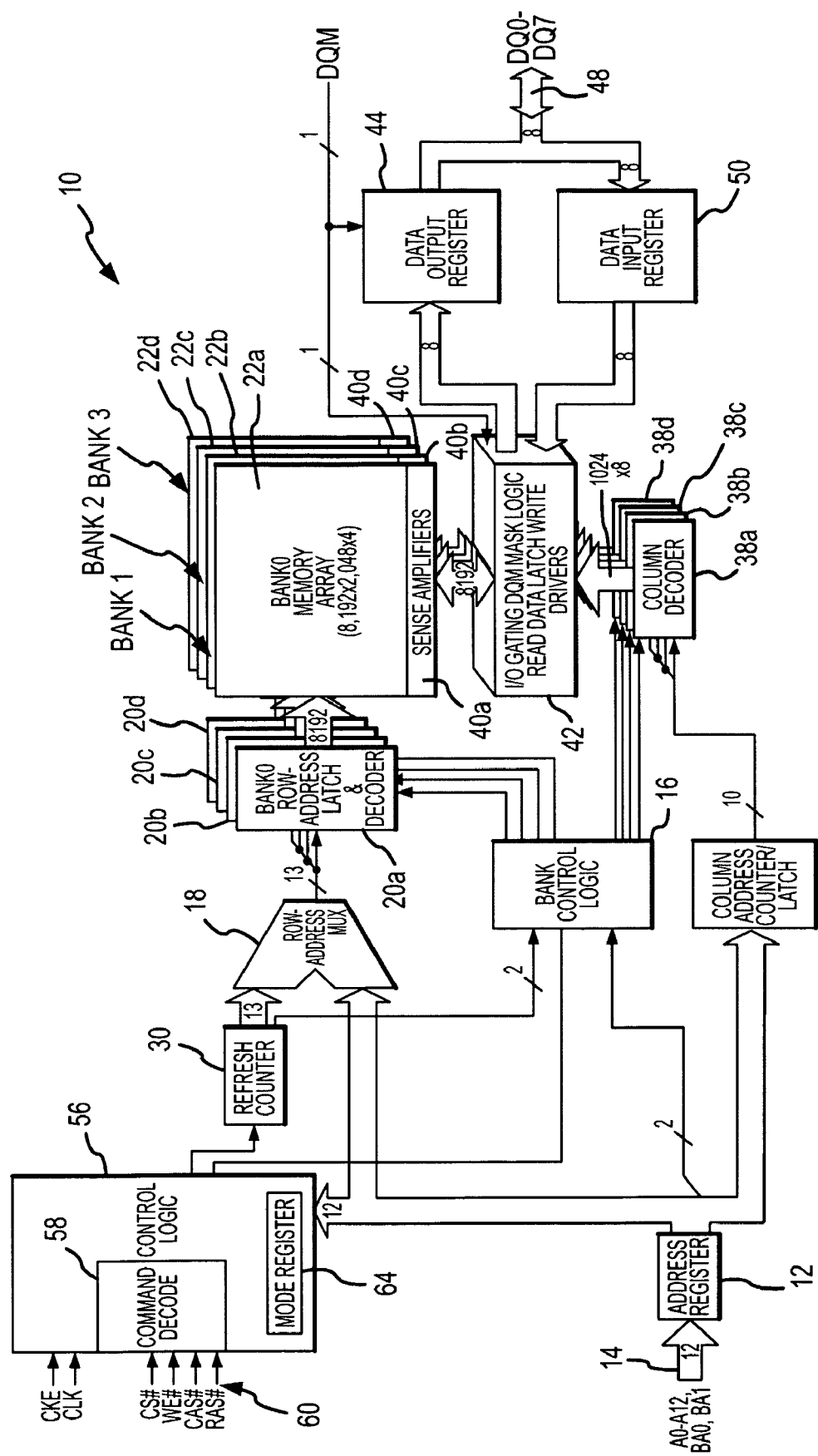
FIG. 1 is a block diagram of a conventional dynamic random access memory device.
Figure 2:
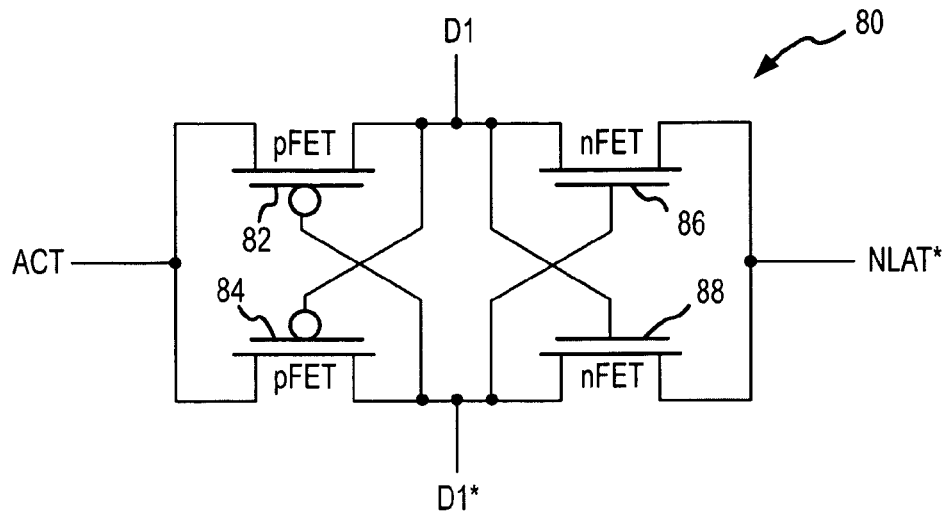
FIG. 2 is a schematic diagram of a conventional sense amplifier used in the dynamic random access memory of FIG. 1.
Figure 5:
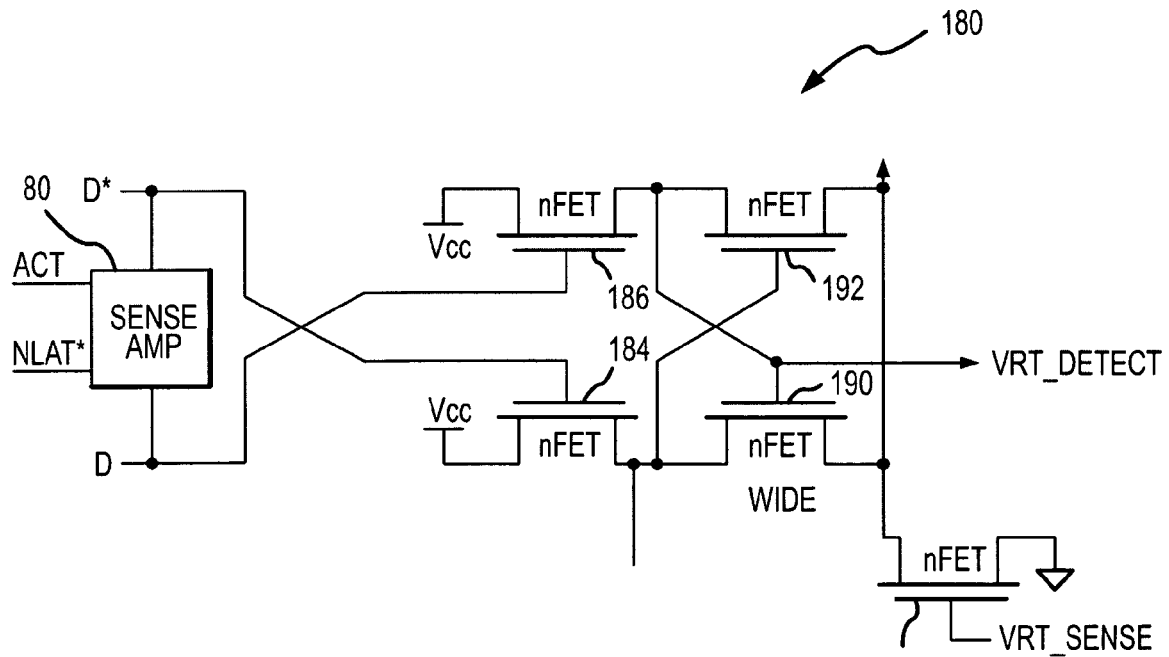
FIG. 5 is a schematic diagram of one embodiment of a sense amplifier comparator that can detect excessively leaky memory cells and can be used in the dynamic random access memory of FIG. 3.

As mentioned above, the second aspect of the SDRAM 100 of FIG. 3 that differs from the SDRAM 10 of FIG. 1 is the use of the comparators 120a-d coupled to respective sense amplifiers 40a-d for detecting which rows of memory cells contain at least one unusually leaky memory cell. One embodiment of a sense amplifier comparator 180 that can be used for the comparators 120a-d of FIG. 3 is shown in FIG. 5. The comparator 180 includes a first NMOS transistor 184 having its gate coupled to the digit line D and a second NMOS transistor 186 having its gate coupled to the digit line D*. The drains of both transistors 184, 186 are coupled to a supply voltage $V_{CC}$. The transistors 184, 186 act as source followers to couple the voltages on the digit lines D, D* to the sources of the transistors 184, 186, respectively, without discharging the digit lines D, D*. The sources of the transistors 184, 186 are coupled to the drains of a pair of cross-coupled NMOS transistors 190, 192, respectively. When enabled, the NMOS transistors 190, 192, function like the NMOS transistors 86, 88 in the sense amplifier 80 of FIG. 2 to drive the digit line D, D* having the voltage with the lower magnitude to ground. The transistors 190, 192 are enabled by coupling their sources to ground through an NMOS transistor 194, which is turned on by a high VRT_Sense signal. The drain of the transistor 190 serves as the output of the comparator 180, and it is coupled to an OR gate (not shown), which also receives outputs from the comparators 180 coupled to all of the other sense amplifiers 80 for the memory cells activated by the word line. The OR gate 196 will therefore output a high in the event any of the memory cells in the active row is unable to retain data after being refreshed.

In operation, a logic "1" corresponding to $V_{CC}$ is written to all of the columns in each bank. The memory cells are then refreshed for at least one refresh cycle. Finally, each row of memory cells is activated thereby coupling either the digit line D to a memory cell to which $V_{CC}$ was previously coupled or the digit line D* to a memory cell that was previously coupled to ground. If the memory cell is sufficiently leaky that it has not retained the data bit written to it, the voltage on the digit line D will be less than the voltage on the digit line D*. As a result, the digit line D will be driven to ground potential while the digit line D* is isolated. The address of the active row is then stored in one of the row address register 130a-n, and a subset of the bits of the active row is stored in one of the address registers 134a-n. The above process can be repeated with different refresh rates to determine which rows contain at least one memory cell that is only slightly leaky, moderately leaky and very leaky. All but the MSB of the addresses of the rows containing slightly leaky memory cells can be stored in respective registers 134a-n so that such rows will be refreshed at twice the normal rate. All but the two MSBs of the addresses of the rows containing moderately leaky memory cells can be stored in respective registers 134a-n so that such rows will be refreshed at four times the normal rate. Finally, all but the three MSBs of the addresses of the rows containing very leaky memory cells can be stored in respective registers 134a-n so that such rows will be refreshed at four times the normal rate. In this manner, rows of memory cells will be refreshed only at the rate needed to retain data during refreshes, and without any row being refreshed more frequently than needed to retain data.

Figure 6:
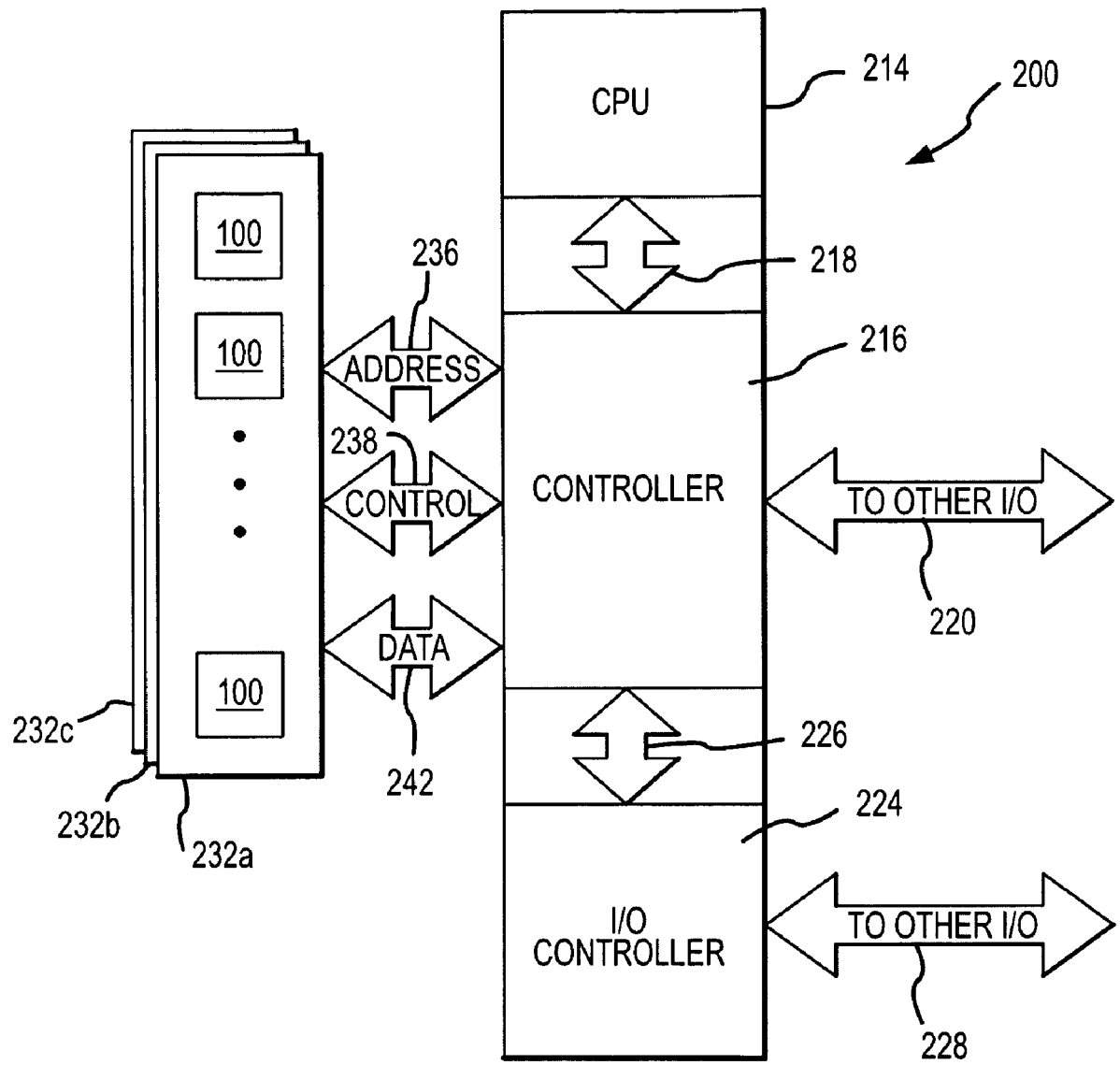
FIG. 6 is a block diagram of a computer system according to one embodiment of the invention.

One embodiment of a computer system 200 using the SDRAM 100 of FIG. 3 or some other embodiment of the invention is shown in FIG. 6. The computer system 200 includes a central processor unit ("CPU") 214 coupled to a system controller 216 through a processor bus 218. The system controller 216 is coupled to input/output ("I/O") devices (not shown) through a peripheral bus 220 and to an I/O controller 224 through an expansion bus 226. The I/O controller 224 is also connected to various peripheral devices (not shown) through an I/O bus 228.

The system controller 216 is coupled to several memory modules 232a-c through an address bus 236, a control bus 238, and a data bus 242. Each of the memory modules 232 a-c includes several of the SDRAMs 100. The data are coupled through the data bus 242 to and from the system controller 216 and locations in the SDRAM 100 in the modules 232 a-c. The locations in the SDRAMs to which data are written and data are read are designated by addresses coupled to the memory modules 232 a-c on the address bus 236. The operation of the SDRAMs 100 in the memory modules 232 a-c are controlled by control signals coupled to the memory modules 232 a-c on the control bus 238.

Although the present invention has been described with reference to the disclosed embodiments, persons skilled in the art will recognize that changes may be made in form and detail without departing from the spirit and scope of the invention.

I claim:

1. A memory device having an array of memory cells arranged in rows and columns, at least some of the rows containing at least one memory cell unable to retain data during refresh, the memory device comprising:
   a row address register circuit operable to receive and store a plurality of row addresses that identity rows of memory cells containing at least one memory cell that is unable to retain data, and operable to store a predetermined number of bits of each of the plurality of row addresses;
   a refresh counter operable to generate refresh row addresses during a refresh cycle;
   a comparator circuit coupled to the row address register circuit and the refresh counter circuit, the comparator circuit operable to compare each of the plurality of row addresses of the row address register and each of the predetermined number of bits to the refresh row addresses generated by the refresh counter and generate a match signal in the event of a match; and
   a control logic circuit coupled to the comparator circuit, the control logic circuit being configured to receive the match signal and operable to refresh the row matched to the row address stored in the row address register responsive to each occurrence of the match signal in a manner that allows the row matched to the stored row address to selectively receive at least an extra refresh.

2. The memory device of claim 1 wherein the predetermined number of bits comprise least significant bits.

3. The memory device of claim 2 wherein the number of times the row matched to the row address stored in the address register is refreshed is increased by decreasing the number of bits selected as the predetermined number of bits.

4. The memory device of claim 1 further comprising:
   a plurality of sense amplifiers coupled to the array of memory cells through respectively coupled digit lines; and
   a plurality of comparator circuits respectively coupled to the digit lines of the plurality of sense amplifiers, the comparator circuit operable to compare the voltages to the respectively coupled digit lines and provide a detection signal indicative of the comparison.

5. The memory device of claim 1 wherein the control logic circuit comprises being further operable to suspend the refresh row addresses from being generated by the refresh counter while the row matched to the row address stored in the row address register is being refreshed responsive to the occurrence of the match signal due matching the predetermined number of bits.

6. A computer system comprising:
   a processor; and
   a memory device having an array of memory cells arranged in rows and columns, at least some of the rows containing at least one memory cell unable to retain data during refresh, the memory device comprising:
   a row address register circuit operable to record a subset of bits of a plurality of row address that identifies a row of memory cells containing at least one memory cell unable to retain data;
   a refresh counter operable to generate refresh row addresses during a refresh cycle and operable to refresh each of the rows of memory cells as row addresses for the rows are generated, wherein a plurality of refresh row addresses contains the subset of bits;
   a comparator circuit coupled to the row address register circuit and the refresh counter circuit, the comparator circuit operable to compare each of the recorded subset of bits with corresponding bits of each refresh row address as each refresh row address is being generated and generate a match signal in the event of a match; and
   a control logic circuit coupled to the comparator circuit, the control logic circuit being configured to receive the match signal and operable to refresh the row matched to the respective row address stored in the row address register in response to the match signal, the match signal being generated each time the subset of bits is matched to one of the plurality of refresh row addresses.

7. The computer system of claim 6 further comprising a plurality of sense amplifier comparator circuits each coupled to each pair of complementary digit lines of respective columns of the memory cells, each of the sense amplifier comparator circuits operable to compare the voltages of the respectively coupled digit lines to determine whether the respective memory cell is unable to retain data and to provide a detection signal indicative of the identified memory cell.

8. The computer system of claim 6 wherein row addresses that identifies a row of memory cells containing at least one memory cell unable to retain data are provided to the row address register circuit from data stored externally in a nonvolatile memory device.

9. The computer system of claim 6 wherein the row address register circuit is stored externally in a memory module.

* * * * *

UNITED STATES PATENT AND TRADEMARK OFFICE
CERTIFICATE OF CORRECTION

PATENT NO. : 7,558,142 B2  
APPLICATION NO. : 12/001709  
DATED : July 7, 2009  
INVENTOR(S) : Dean A. Klein It is certified that error appears in the above-identified patent and that said Letters Patent is hereby corrected as shown below:

In column 9, line 27, in Claim 1, delete "identity" and insert -- identify --, therefor.

Signed and Sealed this

Twenty-fifth Day of August, 2009

David J. Kappos
*Director of the United States Patent and Trademark Office*